(12) United States Patent
Lan

(10) Patent No.: US 8,794,854 B2
(45) Date of Patent: Aug. 5, 2014

(54) FOLDABLE KEYBOARD

(75) Inventor: Tianliang Lan, Guangdong (CN)

(73) Assignee: Shenzhen Doking Electronic Technology Co., Ltd., Shenzhen (CN)

(*) Notice: Subject to any disclaimer, the term of this patent is extended or adjusted under 35 U.S.C. 154(b) by 0 days.

(21) Appl. No.: 13/258,862

(22) PCT Filed: Feb. 28, 2011

(86) PCT No.: PCT/CN2011/071411
§ 371 (c)(1),
(2), (4) Date: Sep. 22, 2011

(87) PCT Pub. No.: WO2012/065380
PCT Pub. Date: May 24, 2012

(65) Prior Publication Data
US 2013/0334020 A1  Dec. 19, 2013

(30) Foreign Application Priority Data

Nov. 17, 2010  (CN) .................. 2010 2 0611335 U
Jan. 25, 2011  (CN) .................. 2011 2 0024656 U

(51) Int. Cl.
*G06F 3/02* (2006.01)
*H05K 7/16* (2006.01)

(52) U.S. Cl.
CPC .............. *G06F 3/0221* (2013.01); *H05K 7/16* (2013.01)
USPC ........ 400/477; 400/472; 341/22; 361/679.08; 361/679.2

(58) Field of Classification Search
CPC ........ H05K 7/16; H04N 1/00554; G06F 3/02; G06F 3/0221
USPC ................ 400/472, 477; 341/22; 361/679.08, 361/679.2
See application file for complete search history.

(56) References Cited

U.S. PATENT DOCUMENTS

| | | | | |
|---|---|---|---|---|
| 5,581,440 A | * | 12/1996 | Toedter | 361/679.28 |
| 6,674,636 B2 | * | 1/2004 | Loo | 361/679.14 |
| 6,793,421 B1 | * | 9/2004 | Baldwin et al. | 400/488 |
| 6,877,919 B2 | * | 4/2005 | Sitalasai et al. | 400/472 |
| 6,930,881 B2 | * | 8/2005 | Karidis et al. | 361/679.55 |
| 2004/0228668 A1 | * | 11/2004 | Hsu | 400/472 |
| 2006/0214916 A1 | * | 9/2006 | Mulford | 345/169 |

* cited by examiner

*Primary Examiner* — Daniel J Colilla
(74) *Attorney, Agent, or Firm* — Jackson IPG PLLC

(57) ABSTRACT

The present invention provides a foldable keyboard comprising a plurality of sections, a flat cable electrically connected between the sections, and a folding component connected between the sections. The folding component comprises fixing parts corresponding to the sections, and a connecting part connected between the fixing parts. The sections are correspondingly fixed on the fixing parts of the folding component. The connecting part is located between the sections. The sections pivot about the connecting part therebetween for folding or unfolding the foldable keyboard. The present invention adopts a folding component to connect the sections of the keyboard for folding the sections of the keyboard thereby being portable. The folding component is easy to manufacture with low cost, effectively reduces the thickness of the keyboard and extends the service life of the keyboard.

6 Claims, 6 Drawing Sheets

FOLDABLE KEYBOARD

FIELD OF THE INVENTION

The present invention relates to a keyboard, and particularly to a foldable keyboard.

BACKGROUND OF THE INVENTION

Keyboards are widely used as an input device. A conventional keyboard generally comprises a base and a key module mounted on the base. The base is of one-piece type, and the keyboard as a whole is comparatively long, and occupies much space, which is not portable.

To improve portability of a keyboard, a foldable keyboard was disclosed. A conventional foldable keyboard comprises two sections that are connected by a hinge, and the two sections are electrically connected via a flat cable. However, the hinge configuration of a conventional foldable keyboard not only makes the size of the keyboard comparatively large, but also increases the production cost, and the flat cable is damaged easily after being used repeatedly. So, it is required to improve.

SUMMARY OF THE INVENTION

An object of the present invention is to provide a foldable keyboard adopting a folding component to connect sections of a keyboard, thereby folding the sections of the keyboard and so being portable; the folding component being easy to manufacture with low cost, effectively reducing the thickness of the keyboard and extending the service life of the keyboard.

To achieve the above mentioned object, a foldable keyboard of the present invention comprises a plurality of sections, a flat cable electrically connected between the sections, and a folding component connected between the sections. The folding component comprises fixing parts corresponding to the sections, and a connecting part connected between the fixing parts. The sections are correspondingly fixed on the fixing parts of the folding component. The connecting part is located between the sections. The sections pivot about the connecting part therebetween to achieve folding or unfolding the foldable keyboard.

The connecting part of the folding component is in an inverted U-shape, and the fixing parts are connected to the two free ends of the connecting part.

The folding component is made of leather, cloth or plastic.

The sections are provided with grooves corresponding to the fixing parts of the folding component for receiving the fixing parts so as to reduce the thickness of the keyboard.

The foldable keyboard further comprises a protective component fixed between the sections.

The protective component is made of flexible plastic materials.

The opposite two sides of the protective component are respectively provided with a guide groove and a containing groove connected to the guide groove; the flat cable passes through the containing grooves whereby the protective component covers the upper surface of the flat cable away from the folding component.

Each section comprises a base body connected to the fixing part of the folding component, and a main body fixed on the base body; the base body is provided with threaded holes, and the folding component is provided with through holes corresponding to the threaded holes; by screws passing through the through holes of the folding component to be engaged with the threaded holes of the base body, the folding component is fixed to the base body.

The protective component is fixed to the surface of the main body of the sections facing the base body, or the protective component is fixed to the surface of the base body facing the folding component; the sections pivot about the protective component therebetween, and the length of the protective component between the sections is equal to or less than the length of the flat cable between the sections.

The advantages of the present invention are described as following: the foldable keyboard of the present invention adopts a folding component to connect sections of a keyboard whereby the sections pivot about the connecting part between the fixing parts of the folding component for folding the sections of the keyboard, to make the foldable keyboard portable. The folding component is easy to manufacture with low cost, effectively reduces the thickness of the keyboard and extends the service life of the keyboard.

The characteristic and the technical solution of the present invention are best understood from the following detailed description with reference to the accompanying figures, but the figures are only for reference and explaining, not to limit the scope of the invention.

BRIEF DESCRIPTION OF THE DRAWINGS

The technical solution and the beneficial effects of the present invention are best understood from the following detailed description with reference to the accompanying figures and embodiments.

In the drawings.

DESCRIPTION OF THE PREFERRED EMBODIMENTS

Figure 1:
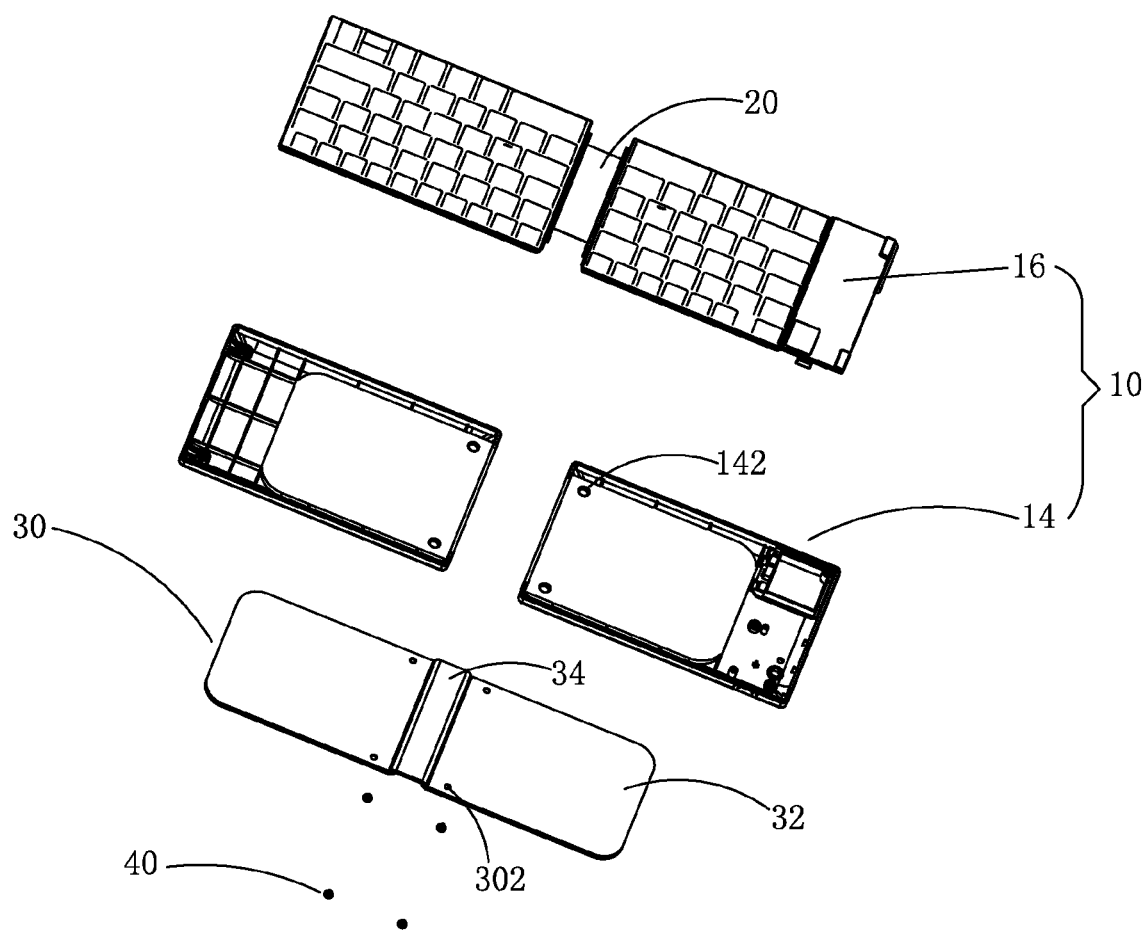
FIG. 1 is an exploded view of a foldable keyboard in accordance with a first embodiment of the present invention.
Figure 2:
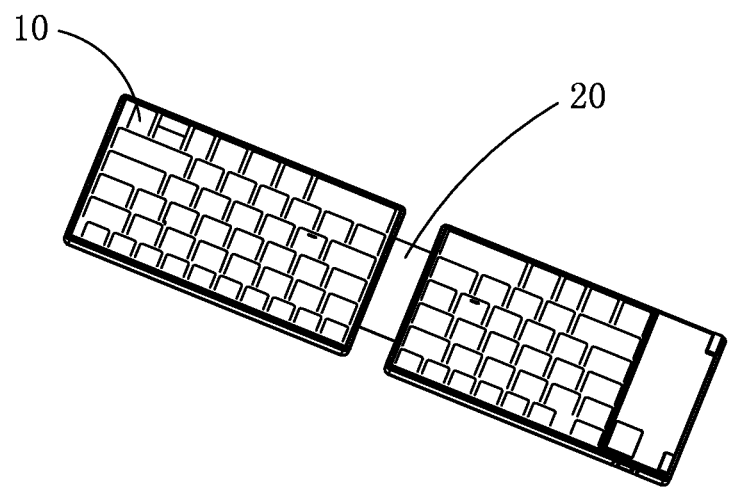
FIG. 2 is an assembled view of a main body and a base body of the sections in FIG. 1.
Figure 3:
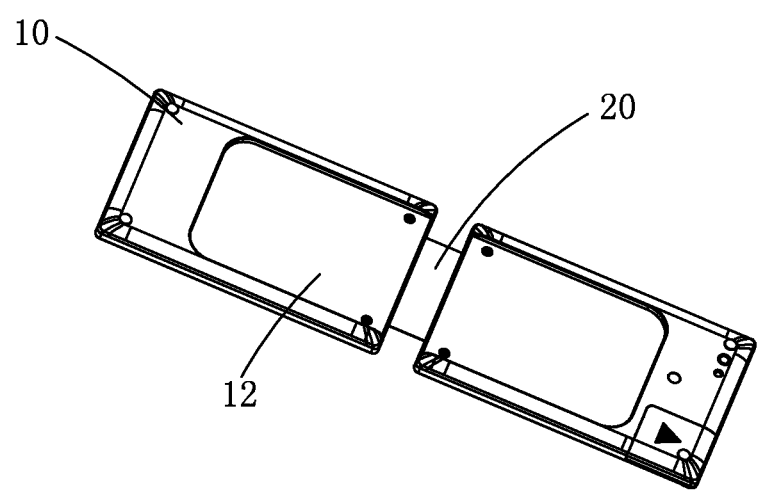
FIG. 3 is a rear elevational view of FIG. 2.
Figure 4:
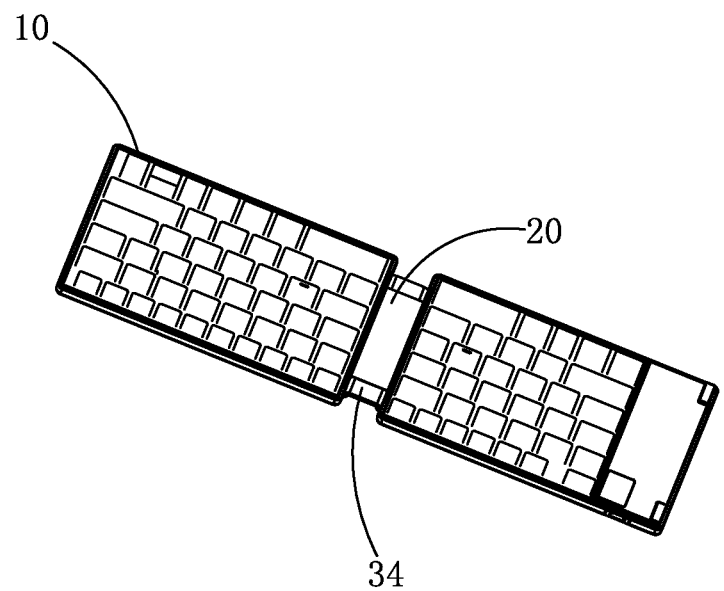
FIG. 4 is an assembled view of FIG. 1.
Figure 5:
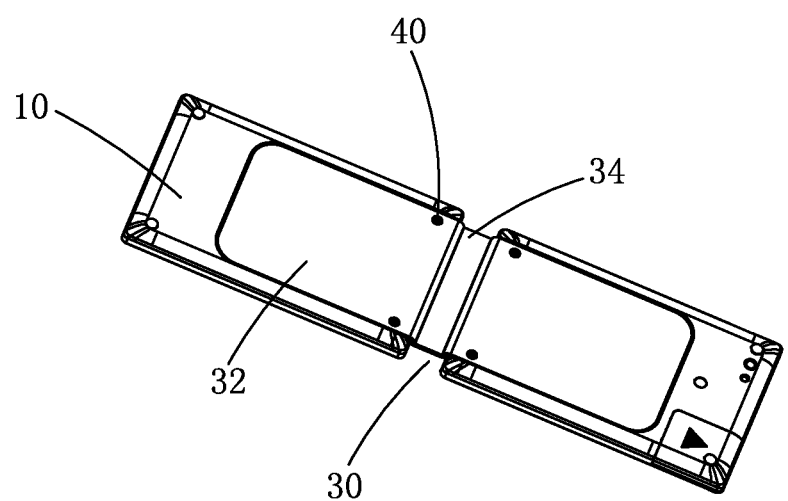
FIG. 5 is a rear elevational view of FIG. 4.
Figure 6:
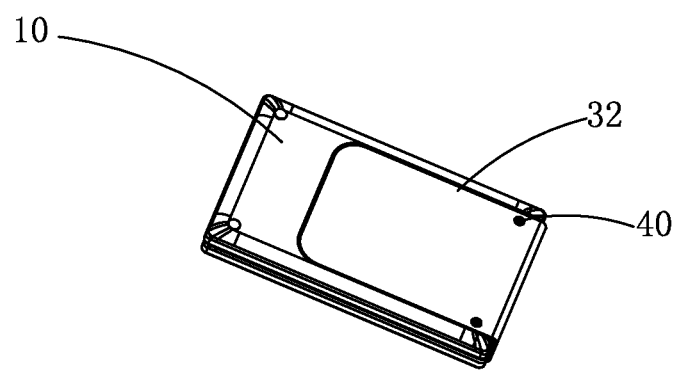
FIG. 6 is a schematic view of the foldable keyboard in FIG. 5 being folded.

Hereinafter, the present invention is described detailedly with reference to the accompanying figures.

As illustrated in FIGS. 1-6, a foldable keyboard in accordance with a first embodiment of the present invention comprises a plurality of sections 10, a flat cable 20 electrically connected between the sections 10, and a folding component 30 connected between the sections 10. The folding component 30 comprises fixing parts 32 corresponding to the sections 10, and a connecting part 34 connected between the fixing parts 32. The sections 10 of the keyboard are correspondingly fixed on the fixing parts 32 of the folding component 30. The connecting part 34 is located between the sections 10. The sections 10 pivot about the connecting part 34 therebetween to achieve folding or unfolding the foldable keyboard. The foldable keyboard of the present invention is convenient for carrying and using. The hinge or shaft of a conventional foldable keyboard is replaced with the connecting part 34 of the folding component 30, which is easy to manufacture with low cost, and can extend the service life of the flat cable 20. Besides, the folding component 30 can also serve as a protection for the keyboard.

The connecting part 34 of the folding component 30 is in an inverted U-shape, and the fixing parts 32 are connected to the two free ends of the connecting part 34. The folding component 30 is made of leather, cloth or plastic. The sections 10 are provided with grooves 12 corresponding to the fixing parts 32 of the folding component 30 for receiving the fixing parts 32, so as to reduce the thickness of the keyboard. The volume of the keyboard is reduced, thereby further improving the portability.

More specifically, each section 10 of the keyboard comprises a base body 14 connected to the fixing part 32 of a folding component 30, and a main body 16 fixed on the base body 14. The base body 14 is provided with threaded holes 142, and the folding component 30 is provided with through holes 302 corresponding to the threaded holes 142. While assembling, the main body 16 is fixed onto the base body 14, and by screws 40 passing through the through holes 302 of the folding component 30 to be engaged with the threaded holes 142 of the base body 14, the folding component 30 is fixed to the base body 14.

Besides, the flat cable 20 comprises metal wires (not shown in the figures) and a protective film (not shown in the figures) covering the metal wires, in the present embodiment. The metal wires are thickened and widened to make the flat cable 20 as a whole be thicker and wider. So, the flat cable 20 will not be dragged easily, and meanwhile the object of further protecting the flat cable 20 is achieved via the help of the protective film covering the metal wires. In the present embodiment, the flat cable 20 and a thin film circuit board (not shown in the figures) of the section 10 of the keyboard are integral.

Figure 7:
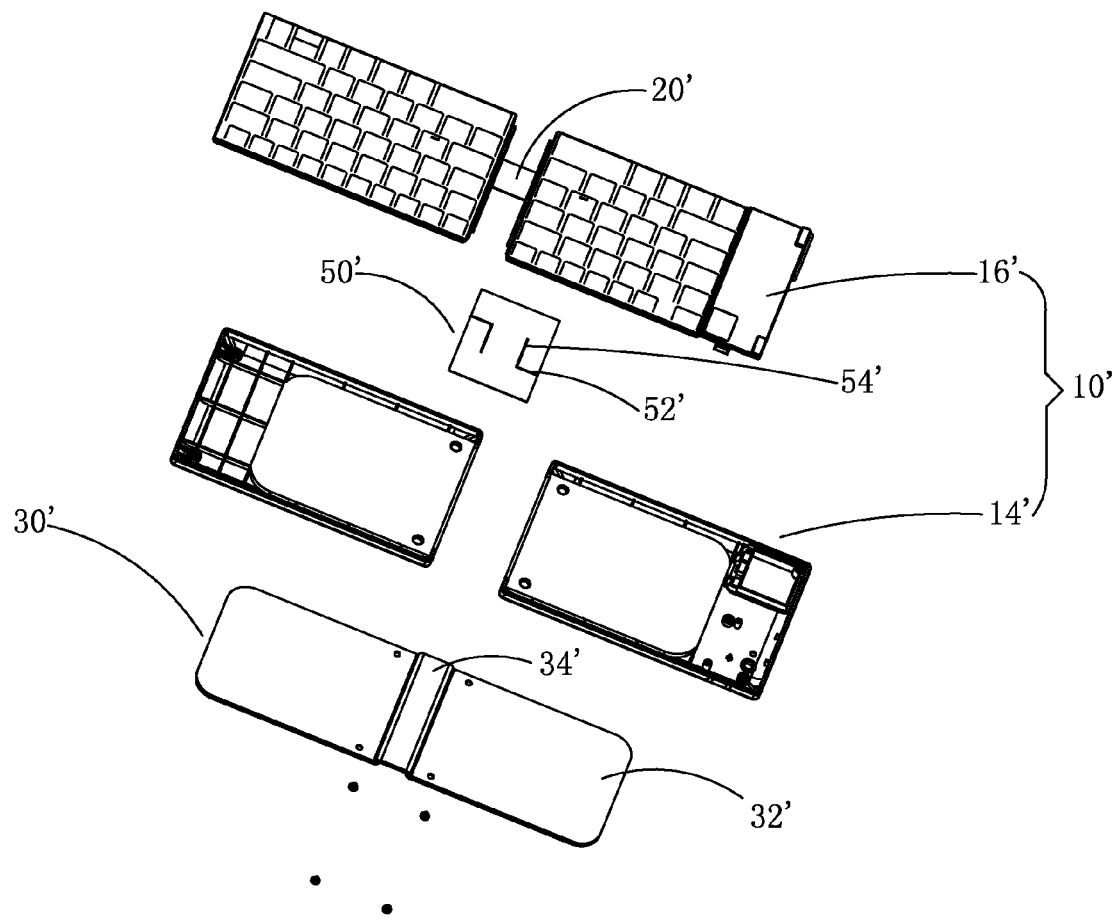
FIG. 7 is an exploded view of a foldable keyboard in accordance with a second embodiment of the present invention.
Figure 8:
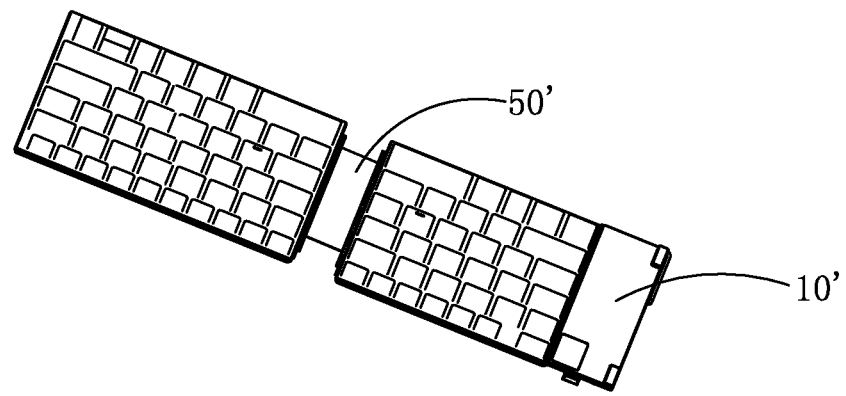
FIG. 8 is a schematic view of the protective component in FIG. 7 being fixed between the sections.
Figure 9:
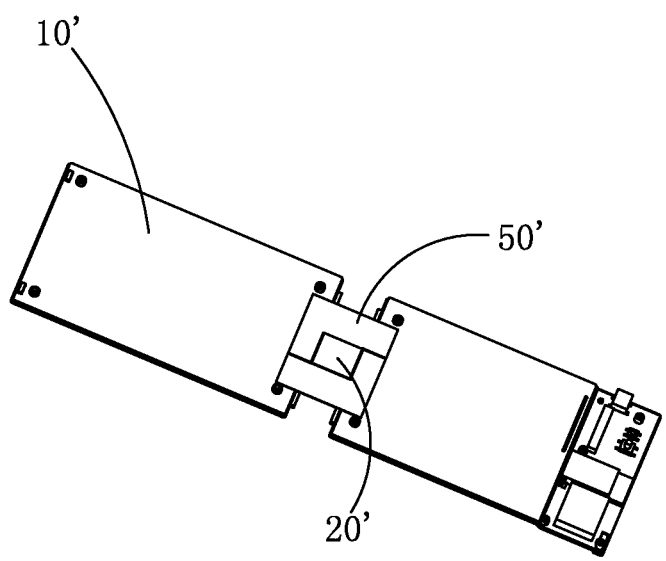
FIG. 9 is a rear elevational view of FIG. 8.

As illustrated in FIGS. 7-9, comparing to the first embodiment, a foldable keyboard in accordance with a second embodiment of the present invention comprises a protective component 50' fixed between the sections 10'. The protective component 50' can be fixed to the surface of the main body 16' of the section 10' facing the base body 14', or the protective component 50' can also be fixed to the surface of the base body 14' facing the folding component 30'. The protective component 50' can be of sheet structure, which is made of flexible plastic materials, such as PVC, PET, and PC. In the present embodiment, the protective component 50' is fixed to the surface of the main body 16' of the section 10' facing the base body 14'. As a selection of the present embodiment, while the fixing parts 32' and the sections 10' thereon pivot about the connecting part 34' between the fixing parts 32' of the folding component 30', the sections 10' pivot about the protective component 50' therebetween, and the length of the protective component 50' between the sections 10' is equal to or less than the length of the flat cable 20' between the sections 10'. The opposite two sides of the protective component 50' are respectively provided with a guide groove 52' and a containing groove 54' connected to the guide groove 52'. The flat cable 20' passes through the containing grooves 54' to make the protective component 50' cover the upper surface of the flat cable 20' away from the folding component 30'. The opposite two sides of the protective component 50' are respectively bonded to the surface of the main body 16' of the corresponding section 10' facing the base body 14', so as to make the protective component 50' fixed to the surface of the main body 16' of the section 10' facing the base body 14'. The protective component 50' prevents the flat cable 20' from being dragged, so as to extend the service life of the flat cable 20'. The protective component 50' can also set the distance between the two sections 10' to be more accurate, so as to make the connecting part 34' of the folding component 30' capable of rotating agilely. Meanwhile, the protective component 50' also improves aesthetic feeling of the whole keyboard.

It is to be understood that the quantity of the sections of the present invention can be three or more than three.

In summary, the foldable keyboard of the present invention adopts a folding component to connect the sections of the keyboard. By the fixing parts and the sections thereon pivoting around the connecting part between the fixing parts of the folding component, the sections of the keyboard can be foldable, thereby being convenient for carrying. Moreover, by replacing a hinge or shaft of a conventional foldable keyboard with the connecting part of the folding component, the production cost is low, and the service life of the flat cable can be extended. Besides, the folding component can also serve as a protection for the keyboard. Moreover, by adding a protective component between the sections, the protective component prevents the flat cable from being dragged, thereby avoiding an open circuit occurring in a circuit of the flat cable, so as to extend the service life of the keyboard. The protective component can also set the distance between the two sections to be more accurate, so as to make the connecting part of the folding component capable of rotating agilely to be convenient for using.

Although the present invention has been described in detail with above said embodiments, but it is not to limit the scope of the invention. So, all the modifications and changes according to the characteristic and spirit of the present invention, are involved in the protected scope of the invention.

What is claimed is:

1. A foldable keyboard comprising
a plurality of sections,
a flat cable electrically connected between the sections, and
a folding component connected between the sections;
the folding component including fixing parts corresponding to the sections, and a connecting part connected between the fixing parts;
the sections being correspondingly fixed on the fixing parts of the folding component,
the connecting part being located between the sections, and
the sections pivoting about the connecting part therebetween for folding or unfolding the foldable keyboard;
wherein the foldable keyboard further comprises a protective component mounted between the sections;
wherein opposite two sides of the protective component are respectively provided with a guide groove and a containing groove connected to the guide groove;
the flat cable passing through the containing grooves to make the protective component cover the upper surface of the flat cable away from the folding component.

2. The foldable keyboard of claim 1,
wherein the folding component is made of leather, cloth or plastic.

3. The foldable keyboard of claim 1,
wherein the sections are provided with grooves corresponding to the fixing parts of the folding component for receiving the fixing parts.

4. The foldable keyboard of claim 1,
wherein the protective component is made of flexible plastic materials.

5. The foldable keyboard of claim 1,
wherein each section comprises a base body connected to the fixing part of the folding component, and a main body fixed on the base body;
the base body is provided with threaded holes, and
the folding component is provided with through holes corresponding to the threaded holes;
the folding component is fixed to the base body by screws passing through the through holes of the folding component and engaging with the threaded holes of the base body.

6. The foldable keyboard of claim 5,
wherein the sections pivot about the protective component therebetween, and the length of the protective component between the sections is equal to or less than the length of the flat cable between the sections.

\* \* \* \* \*